United States Patent
Tu et al.

(10) Patent No.: US 7,561,482 B2
(45) Date of Patent: Jul. 14, 2009

(54) DEFECTIVE BLOCK ISOLATION IN A NON-VOLATILE MEMORY SYSTEM

(75) Inventors: Loc Tu, San Jose, CA (US); Wangang Tsai, Sunnyvale, CA (US)

(73) Assignee: Sandisk Corporation, Milpitas, CA (US)

( * ) Notice: Subject to any disclaimer, the term of this patent is extended or adjusted under 35 U.S.C. 154(b) by 201 days.

(21) Appl. No.: 11/470,945

(22) Filed: Sep. 7, 2006

(65) Prior Publication Data

US 2008/0062761 A1    Mar. 13, 2008

(51) Int. Cl.
G11C 29/00    (2006.01)
G11C 7/00    (2006.01)

(52) U.S. Cl. ...................................... 365/200; 365/201
(58) Field of Classification Search ............. 365/200 O, 365/201 X, 200, 201
See application file for complete search history.

(56) References Cited

U.S. PATENT DOCUMENTS

| | | | |
|---|---|---|---|
| 5,386,386 A | | 1/1995 | Ogihara |
| 6,345,367 B1 | | 2/2002 | Sinclair |
| 6,639,858 B2 | | 10/2003 | Kinoshita et al. |
| 6,888,764 B2 * | | 5/2005 | Shiga et al. .................. 365/200 |
| 7,159,141 B2 * | | 1/2007 | Lakhani et al. ................. 714/8 |
| 7,336,536 B2 * | | 2/2008 | Louie et al. ............. 365/185.09 |
| 7,336,537 B2 * | | 2/2008 | Louie et al. ............. 365/185.09 |
| 7,447,069 B1 * | | 11/2008 | Harari et al. ........... 365/185.11 |
| 2004/0080998 A1 | | 4/2004 | Chang et al. |
| 2006/0140027 A1 * | | 6/2006 | Tominaga ................... 365/200 |

OTHER PUBLICATIONS

International Search Report and Written Opinion of International Application No. PCT/US2007/019030 (SD-SDA-1016-PCT) mailed May 8, 2008.

* cited by examiner

*Primary Examiner*—VanThu Nguyen
(74) *Attorney, Agent, or Firm*—Dugan & Dugan, PC

(57) ABSTRACT

A method and apparatus provide an improved identification and isolation of defective blocks in non-volatile memory devices having a plurality of user accessible blocks of non-volatile storage elements where each block also has an associated defective block latch. The method provides for sensing each defective block latch to determine whether the defective block latch was set due to a defect, and storing, in temporary on chip memory, address data corresponding to each set latch. The method further involves retrieving the address data and disabling defective blocks based upon the address data. A non-volatile memory device is also described having a controller which senses the defective block latches, stores address data for each block having a set latch, and subsequently retrieves the stored address data to set the defective block latches based upon the address data.

18 Claims, 5 Drawing Sheets

| Byte 0 | | Byte 2 | | 170 |
|---|---|---|---|---|
| Flag (1bit) | Block address [6:0] | Dummy bits | Block address[12:7] | |
| Byte 1 | | Byte 3 | | |
| /Flag(1bit) | /Block address[6:0] | /Dummy bits | /Block address[12:7] | |

DEFECTIVE BLOCK ISOLATION IN A NON-VOLATILE MEMORY SYSTEM

BACKGROUND

The present invention relates generally to the field of non-volatile memory and more particularly to methods and apparatus for isolating defective blocks of memory in a non-volatile memory system.

The use of memory has been increasing due to rapid growth of storage needs in the information and entertainment fields and due to the decreasing size and cost of memory. One type of memory widely used is non-volatile semiconductor memory which retains its stored information even when power is removed. There are a wide variety of non-volatile erasable programmable memories. One widely used type of non-volatile memory is flash memory. A typical commercial form of flash memory utilizes electrically erasable programmable read only memory (EEPROM) devices composed of one or more arrays of transistor cells, each cell capable of non-volatile storage of one or more bits of data. The storage cells are partitioned internally into independent blocks, each of which forms a set of storage locations which are erasable in a single operation. Each block is the smallest unit which can be erased in a single operation.

When a flash memory device is manufactured, manufacturing defects are normally identified by the manufacturer by in factory testing. In general, as long as a flash memory includes less than a certain number of defective or unusable physical blocks, the flash memory may be sold. In order to increase yield, the manufacturer may include a number of redundant or spare blocks to be used to replace defective blocks. If the number of defective blocks exceeds the number of spare blocks the device is typically discarded. Conventionally, defective blocks at the factory are identified by a test system which tests each device separately and stores the address of defective blocks in test system memory creating a list of defective blocks.

Typically, the test system process for identifying defective blocks begins with providing power to the memory device to be tested and then all blocks of the memory are scanned to identify defective blocks. As the defective blocks are identified, a list of the addresses of the defective blocks is created in the memory of the test system. Once the testing of the device is completed, the defective blocks are marked as defective to permit preventing the defective blocks from being used. In a common approach, the defective blocks or selected pages of the defective block are each individually written (programmed) with all zeros. Other defect marking indicia may also be used. Subsequently, when the memory device is powered up for use, the memory blocks are scanned and the addresses of the marked blocks (e.g., blocks with all zeros stored) are used to create a list of defective blocks. This list is stored in temporary storage on the memory device and used to isolate the defective blocks so that they are not used.

This testing process results in each tested memory device being individually programmed with a defective block indicia such as all zeros. Since testing is typically performed on large numbers (e.g., a wafer of many die) of memory devices, the testing is inefficient unless many devices can be tested in parallel. Parallel testing of many memory devices at a time using the conventional test process requires a complex test system with large amounts memory to store the lists of defective blocks and then program the blocks. Further, this conventional approach limits the number of blocks that can be defective on a usable memory because the memory device cannot usually be sold if the number of defective blocks exceeds the spare blocks manufactured on the memory device.

Therefore, there is a need for a method and apparatus which enables identification and isolation of defective memory blocks which does not require storage of defective block lists in the test fixture. In addition, there is a need for a method and apparatus to enable more efficient marking of defective blocks which does not require that each defective block be separately programmed to indicate it is defective.

SUMMARY

In one embodiment, a method is provided for processing defective blocks in a non-volatile memory device each having a plurality of user accessible blocks of non-volatile storage elements with each block having an associated defective block latch. The method comprises sensing each defective block latch to determine whether the defective block latch was set due to defect, and storing, in temporary memory within the memory device, address data corresponding to each latch which was found to be set. The method further comprises retrieving the address data and disabling defective blocks based upon the address data.

In another embodiment, a non-volatile memory device is provided comprising a plurality of user accessible blocks of non-volatile storage elements, each block having an associated defective block latch. The device also comprises a controller which senses the defective blocks latch of each block and stores, in temporary storage on the memory device, address data correspondence to each block having the associated defective block latch set to indicate the block is defective. The controller subsequently retrieves the stored address data and uses the address data to set the defective block latches corresponding to the address data to disable user accessible blocks based upon the address data.

BRIEF DESCRIPTION OF THE DRAWINGS

The features of the present invention, which are believed to be novel, are set forth with particularity in the appended claims. The invention, together with further advantages, may best be understood by reference to the following description taken in conjunction with the accompanying drawings. In the figures, like reference numerals identify like elements.

DETAILED DESCRIPTION

Figure 1:
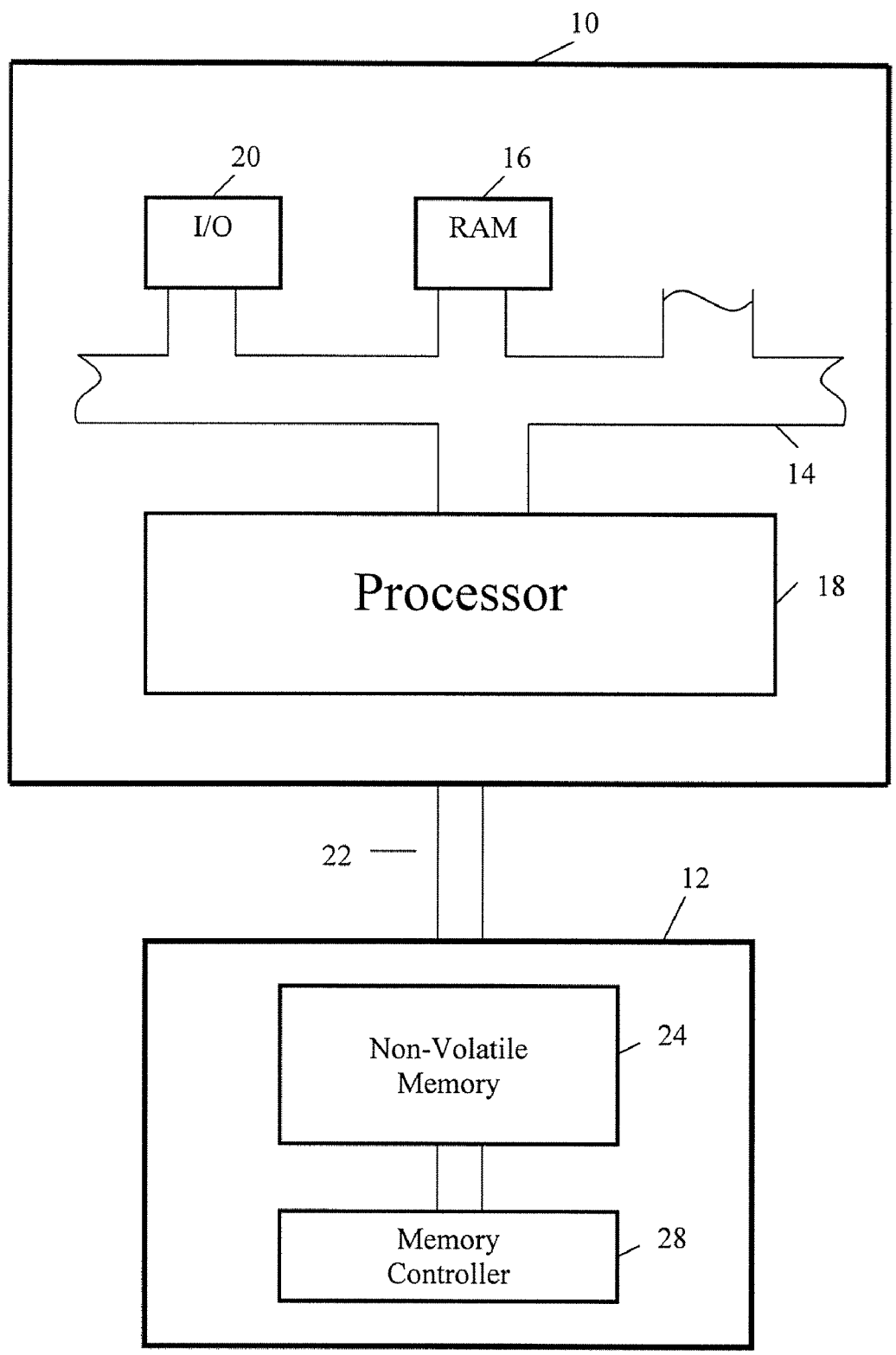
FIG. 1 is a block diagram of an example of a testing system for testing of memory devices, such as a non-volatile memory device.

While the present invention is susceptible of embodiments in various forms, there is shown in the drawings and will hereinafter be described some exemplary and non-limiting embodiments, with the understanding that the present disclosure is to be considered an exemplification of the invention and is not intended to limit the invention to the specific embodiments illustrated. In this disclosure, the use of the disjunctive is intended to include the conjunctive. The use of the definite article or indefinite article is not intended to indicate cardinality. In particular, a reference to "the" object or "an" object is intended to denote also one or a possible plurality of such objects.

FIG. 1 is a block diagram of a specific example of a testing system 10 for testing of memory devices such as non-volatile memory device 12. The illustrated test system 10 includes a system bus 14 which allows the system processor 18, a random access memory (RAM), and other components such as an input/output circuit 20 to communicate, for example with the memory device 12 and an operator. The system 10 may optionally include other components (e.g., additional memory such as ROM, registers, network interface) which are not shown. The test system 10 interfaces with the memory device 12 via a link 22 for testing. The processor 18 controls the testing process according to test programming stored in memory such as the RAM 16. The non-volatile memory device 12 includes non-volatile memory array 24 and memory controller 28. The non-volatile memory 24 may be any non-volatile memory, many types and variations of which are known in the art. For example, one well known suitable non-volatile memory is a NAND flash memory. Such non-volatile memory is arranged to store data so that the data can be accessed and read as needed. The storing, reading and erasing of data are generally controlled by the memory controller 28. In some instances, the controller 28 may be located on a separate physical device.

Figure 2:
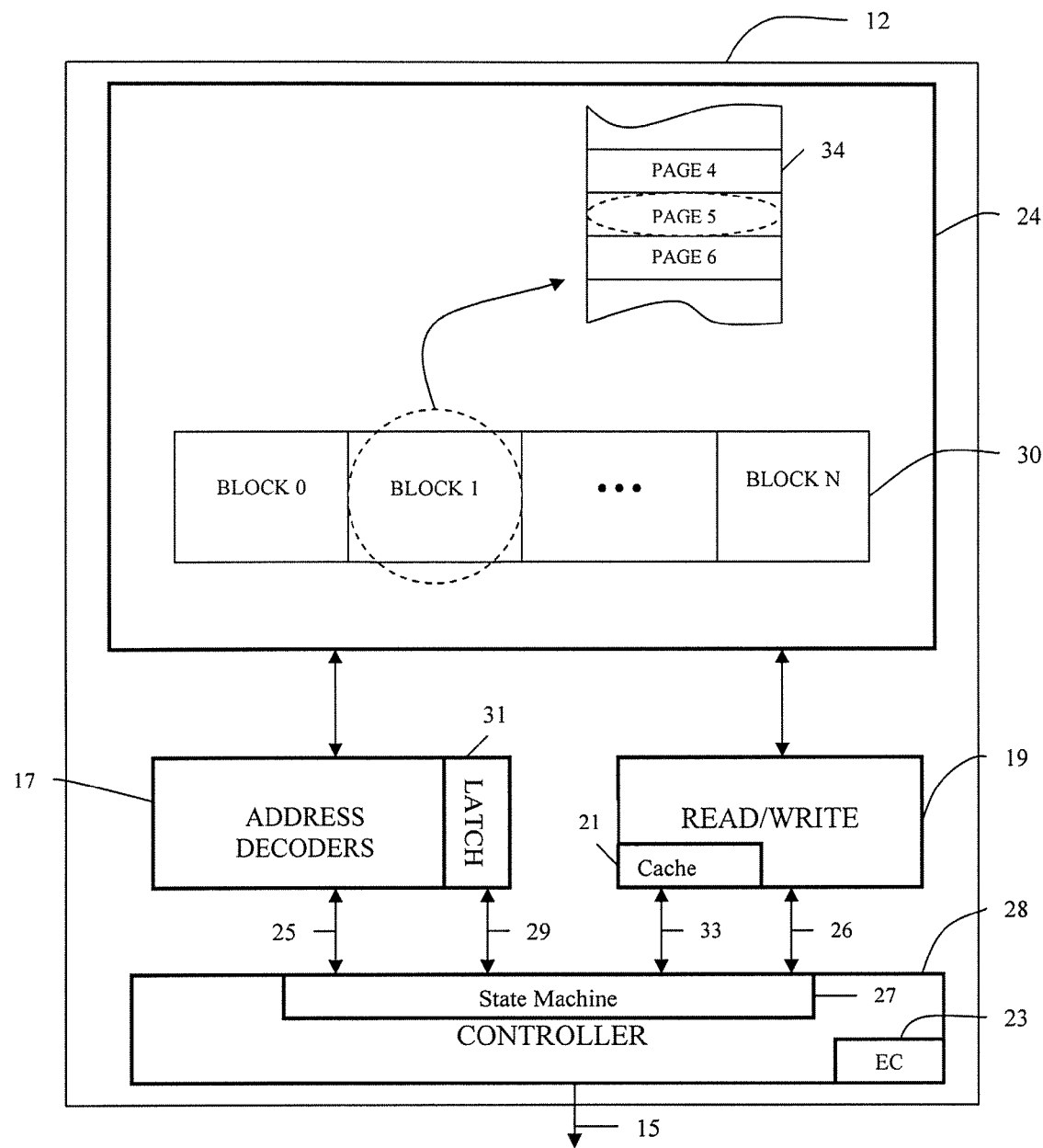
FIG. 2 depicts a detailed block diagram of one embodiment of a non-volatile memory device such as that illustrated in FIG. 1.

A detailed block diagram of an illustrative example of the memory device 12 is shown in FIG. 2 including the non-volatile memory array 24 and controller 28. The memory array 24 may be an array of non-volatile memory cells, each cell capable of storing one or more bits of data and arranged in N blocks 30, as illustrated.

The memory 12 communicates over a bus 15 to other systems, for example, the test system 10 via the link 22 shown in FIG. 1. The controller system 28 controls operation of the memory array 24 to write data, read data and perform various housekeeping functions to operate the memory array 24. The controller 28 generally may comprise one or more state machines 27 to perform specific processes associated with non-volatile memory, and may also include various other logic and interface circuits (not shown).

The memory cell array 30 of the illustrated embodiment may comprise a number (N) of blocks 30 of memory cells addressed by the controller 28 through block address decoders 17 and read/write circuit 19. Each block may be individually selected by applying a block address to the block decoder 17. The block decoder 17 includes a defective block latch 31 for each block which disables reading of the respective block when the latch is set. The latches 31 do not hold data when power is removed. The decoder 17, in well known manner, applies correct voltages to the memory array 24 to select the addressed block to permit programming (write), reading, or erasing data for the block being addressed. In addition, each memory circuit includes read/write circuit 19. The circuit 19 includes sense amplifiers and drivers that control voltages applied to write or program data to addressed cells, and to read data from addressed memory cells. Circuit 19 also includes column address decoders (not shown) for decoding the column addresses, and a write cache 21 made up of registers for temporary storage of data. Data to be programmed into the array 24, or data recently read from the array 24, are typically stored in this write cache 21. In the illustrated embodiment, the state machine 27 couples column addresses 26 and block addresses 25 to the read/write circuit 19 and block decoders 17 respectively. In addition, the state machine couples data to and from the write cache 21 on a data bus 33, and accesses the defective block latches 31 via latch access channel 29 to read or set/reset the latch 31 selected by the block address.

The memory array 24, in the illustrated embodiment, has a large number N of blocks 30 of memory cells where N can be in a wide range. In one typical example N may be about 4000. As is common in flash memory systems, the blocks 30 are typically the smallest unit that can be erased. That is, each block contains the minimum number of memory cells that are erased together. It is common in flash memory to divide each block into a number of pages 34 as illustrated in FIG. 2 (e.g., a typical block may have 128 pages and made up of approximately 2000 bytes each). Additionally, an EC portion 23 may be included in the controller 28 to perform error correction when data is being read from or programmed into the array 24. In one common convention in flash memory, data programmed or written to the memory cells are zero, and erased data are ones. The memory array 30 may comprise several kinds of blocks including user blocks, one or more ROM blocks and RD blocks. User blocks comprise the bulk of the blocks and are the blocks for user storage accessible by standard user commands such as read, program and erase. The ROM blocks are those accessible with special restricted commands used for storage of parameters and information to be returned upon power up of the device. The RD blocks are redundant blocks set aside for remapping defective user blocks. The ROM blocks also have limited amounts of storage to save defective block information for the remapping of the defective blocks.

To test the device 12 for defective blocks, the user blocks will be scanned for defects and the defective block latch 31 is set when a defective block is found. Then, instead of programming or erasing each defective block as is conventionally done, all the user blocks and RD blocks in the device 12 are flash programmed/erased except those with the defective block latch 31 set. Data in the ROM block will also not be affected. In the illustrated embodiment, the state machine 27 implements sensing of each defective block latch 31 on the access channel 29 and writes a set of address data into the write cache 21 for each latch 31 found to have been set by the test scan. All the set latches 31 are then reset, and all the user blocks and RD blocks are programmed with an indicia of defect (with zeros in the illustrated embodiment). The defective block latches 31 are then set by the state machine 27 which first retrieves the defective block addresses from the write cache 21. All the user and RD blocks are then flash erased leaving the zeros in the defective blocks because the defective blocks have had the erase disabled by the setting of the latches 31. In this way the defective blocks can be efficiently programmed with an indicia of defects (e.g., all zeros) without having to program each block separately and without storing the defective block addresses in test system 10 memory.

Figures 3, 5:
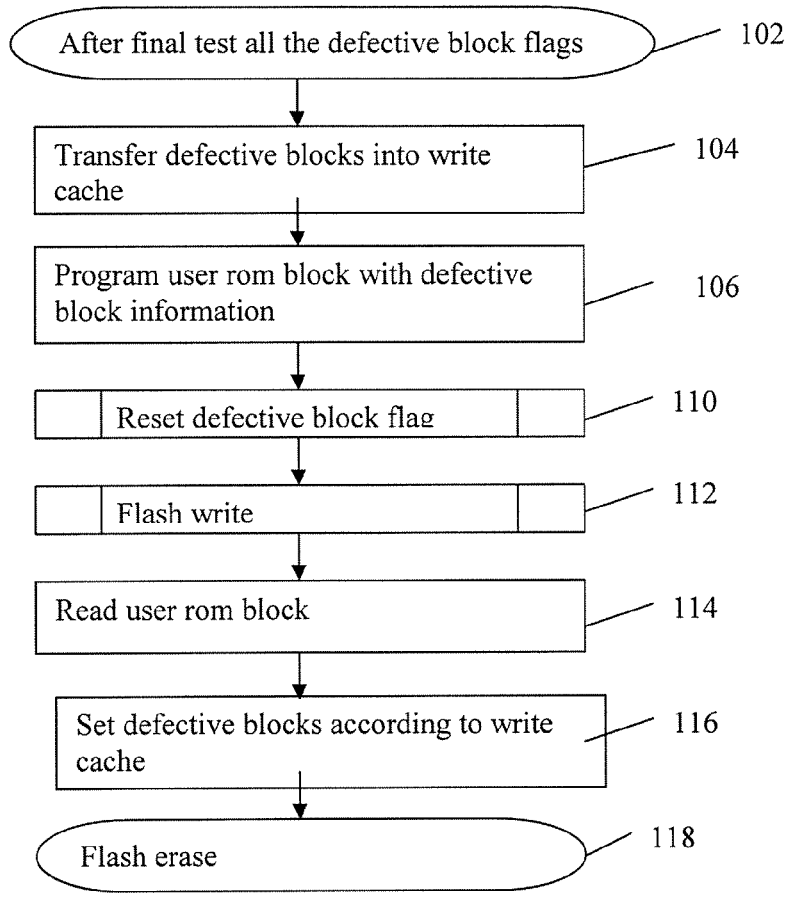
FIG. 3 is a flow diagram depicting an embodiment of a method of processing a non-volatile memory to isolate defects.
FIG. 5 is diagrammatic illustration of an example of a suitable format for defective block information in write cache.

A diagrammatic illustration of an exemplary data structure 170 for a set of defective block address data is illustrated in FIG. 5. In this illustrative example, the address data may contain 10-12 bits plus a flag bit. To reduce errors, redundant data is desirable to permit error detection and correction. Thus, in the illustrated embodiment, four bytes of data are used. As shown, byte 0 contains bits 0-6 of the address, and a flag bit, and byte 2 contains one to three dummy bits and address bits 7-12. In addition, the redundant data is made up of the complement of bytes 0 and 2 in bytes 1 and 3 as shown. In the illustrated example, one such four byte address data set is formed and stored for each defective block.

FIG. 3 is a flow diagram 100 illustrating an embodiment of a process suitable for use with a system such as that illustrated in FIG. 1 for efficiently identifying and isolating the defective blocks of a non-volatile memory 12. During the testing, as the test system 10 scans the blocks 30 of the memory device 12, it sets the defective block latch 31 for each block it detects as defective. Thus, once all of the memory blocks 30 of a memory device 12 have been tested, the defective block latches 31 on all the defective blocks within the device 12 will be set, as indicated at the flow diagram initial position 102. The processor 18 of the test system 10 will initiate the transfer of the address information of the defective blocks into the write cache 19. This transfer may, in one embodiment, be implemented by the state matching 27 of the controller 28.

Figure 4:
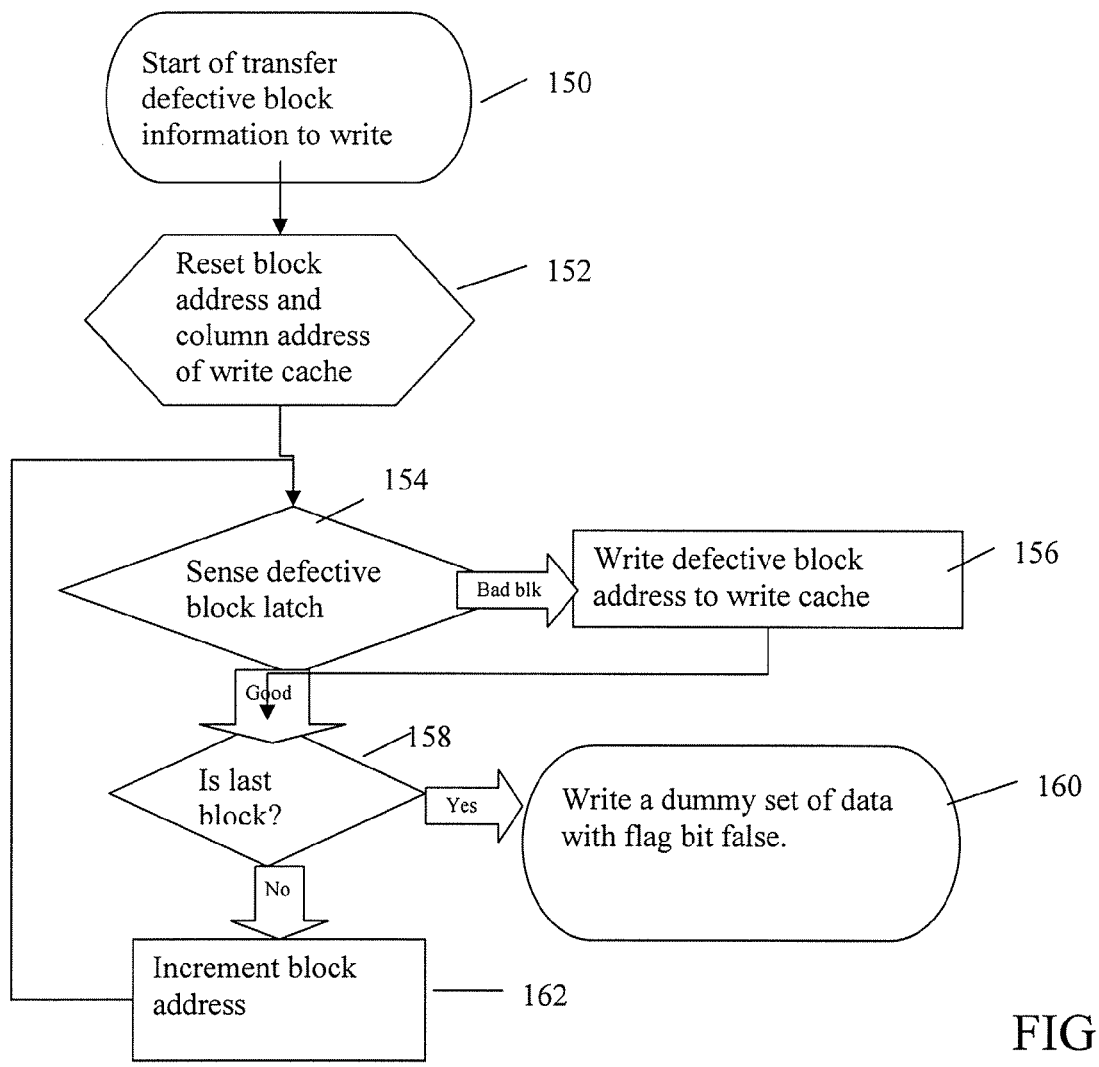
FIG. 4 is a detailed flow diagram depicting one embodiment of the transfer of defective block addresses into write cache illustrated in FIG. 3.

A detailed example of a process for transferring defective block address information is illustrated in FIG. 4. The block address and column address of the write cache is first reset by the state machine 27 to the beginning location of the write cache 21 at step 152. The state machine then scans through the defective block latches 31 of each user block 30. In the illustrated embodiment, this process is performed by sensing a defective block latch 31 using the defective block latch access channel 29 and determining if it is set (i.e., indicating the block is defective) at step 154. If the defective block latch 31 is set, the address information of that block is written to the write cache 21 as illustrated at step 156, after which processing proceeds to step 158, as shown. If the defective block latch 31 is not set at step 154, the state machine checks to determine if the block currently being addressed is the last block in the memory, as illustrated at step 158. If so, a dummy set of data with the flag bit false is written to the write cache to mark the end of the defective block data as illustrated at step 160. If the block being addressed is not the last block, the block address is incremented and the processing returns to step 154 as shown, to examine the next block in the memory. This cycle will continue through all the memory blocks until the last block is examined resulting in a data set of address data in the write cache for each of the defective blocks. In one embodiment all user and RD blocks are addressed.

Returning to FIG. 3, after all the defective block address data has been written to the write cache at step 104, the bad block addresses are written into the ROM block as illustrated at step 106. The ROM provides non-volatile storage of the defective block addresses. The test system 10 then initiates resetting of the defective block latches as illustrated at step 110 so that writing (programming) of the defective blocks is enabled. A flash write is then initiated at step 112 to write zero's in all memory locations of all user and RD blocks, both good and defective. The defective block addresses stored in the ROM block are then read by the state machine from the ROM block at step 114 and stored into the write cache 21. The defective block address information stored in the write cache is then used to set the defective block latches 31 so as to disable the bad blocks as illustrated at step 116.

Figure 6:
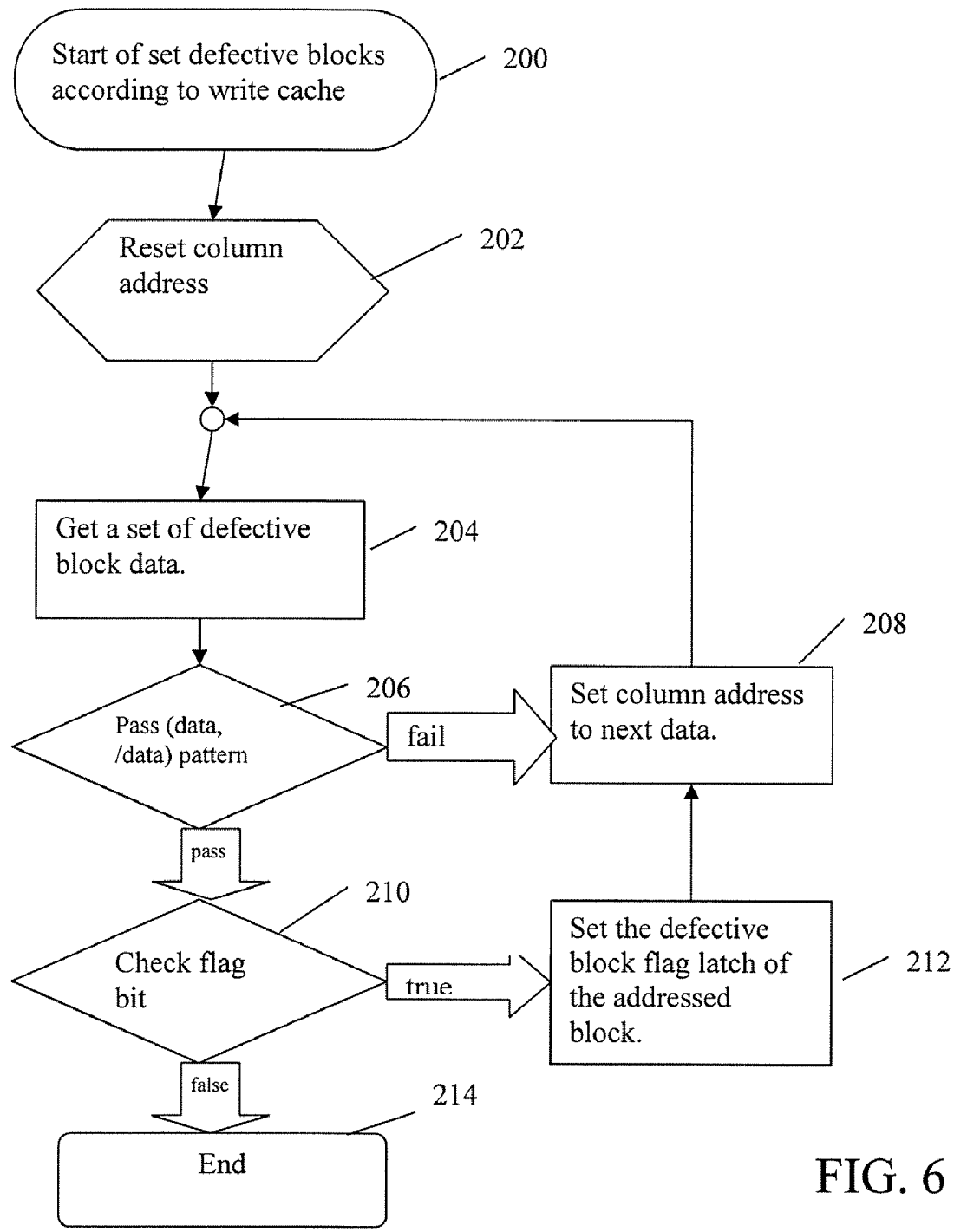
FIG. 6 is a detailed flow diagram of one example of the setting of defective block latches illustrated in FIG. 3.

FIG. 6 is a detailed flow diagram of one embodiment of implementation, for example in the state machine 27, of the step 116 of setting the defective block latches. Once the step is initiated at step 200, the state machine begins by resetting the column address to the beginning of the bad block address data in the write cache 21. Then a set of defective block address data 170 (e.g., are FIG. 5) is read by the state machine at step 204 and an error correction check is performed at step 206 using the redundant data (e.g., bytes 1 and 3 of data set 170, FIG. 5). If the error correction check fails at step 206, the column address is incremented to the next address at step 208, and the state machine 27 returns to get the next defective block address, illustrated at steps 204, as shown. If the error correction check passes at step 206, the flag bit in the address data set is checked at step 210 and if true, the defective block latch 31 of the then addressed block is set via the latch access channel 29 as shown at step 212. This setting of the defective block latch results in disabling the read, write and erase of the defective block. The state machine 27 then increments to the next set of address data at step 208 and returns to step 204 as shown. If the flag bit at step 210 is false, indicating the last address data set has already been read, the step 116 in the illustrated example is complete.

In an embodiment in which the write cache is relatively limited, the steps 104 and 106, as well as steps 114 and 116 may be performed repetitively. For example, in an embodiment with a write cache of a single page of memory, the state machine 27 may perform the transfer of defective block addresses at 104 as previously described until the write cache 21 is full. The entire page of address data in the write cache 21 is then stored into the ROM at step 106 after which processing returns to step 104 where another page of address data is written to the write cache 21. This process continues until the last defective block latch has been sensed and the last address data stored in the ROM at step 106. Processing then continues through the steps 110 and 112 to step 114 as previous described, and the first page of address data from the user ROM is read into the write cache 33 at step 114. The first page of address data is then used to set the defective block latch 31 at step 116. The state machine 27 returns to step 116 to retrieve the next page of address data and uses it to set the defective block latches for those addresses at step 116. This process repeats until the last page of address data has been retrieved and the last defective block latch has been set.

Returning to FIG. 3, after the defective block latches have been set at step 116, the memory is flash erased as illustrated at step 1118. This results in the defective blocks (which at this point have been disabled so as to be unerasable) remaining programmed with all zero's while the good blocks are erased leaving then with all ones. Thus, the defective blocks have retained the indication of defect, in this example all zeros, without having to be individually programmed and without having to store defective block addresses off the memory device.

It is to be understood, of course, that the present invention in various embodiments can be implemented in hardware, software, or in combinations of hardware and software.

The invention is not limited to the particular details of the example of apparatus and method depicted, and other modifications and applications are contemplated. Certain other changes may be made in the above-identified apparatus and method without departing from the true spirit and scope of the invention herein involved. For example, although the invention is depicted with reference to flash memory, the method and apparatus of the present invention can be utilized with any memory system that divides the available management blocks of storage elements. It is intended, therefore that the subject matter in the above description shall be interpreted as illustrative.

What is claimed is:

1. A method of processing defective blocks in a non-volatile memory device that comprises a plurality of user accessible blocks of non-volatile storage elements, each block having an associated defective block latch, the method comprising:

sensing each defective block latch to determine whether the defective block latch was set due to a defect;

storing, in temporary memory within the memory device, address data corresponding to each set latch;

retrieving the address data;

disabling defective blocks based upon the address data;

resetting the set defective block latches after the address data has been stored; and programming substantially all the user accessible blocks with an indicia indicating each respective block is defective.

2. The method of claim 1 wherein the retrieving step further comprises erasing the indicia from user accessible blocks which have not been disabled.

3. The method of claim 2 wherein the temporary memory comprises data registers associated with read and write circuitry of the memory device.

4. The method of claim 1 wherein the step of sensing further comprises detecting that a last user accessible block has been sensed and storing a marker to indicate an end of the address data.

5. The method of claim 1 wherein the programming comprises programming each user accessible block with all zeros.

6. The method of claim 1 wherein the address data is stored in the form of address data and redundant address data.

7. The method of claim 2 wherein storing the address data further comprises storing a flag bit set to a first state with the address data for each set latch and storing a flag bit set to a second state when all user assessable blocks have been sensed, and wherein the step of disabling blocks corresponding to the address data further comprises checking each flag bit and setting a corresponding defective block latch if the flag bit is in the first state, and initiating the step of erasing if the flag bit is in the second state.

8. The method of claim 6 wherein step of retrieving the address data comprises error detection using the redundant data.

9. A non-volatile memory device comprising:

a plurality of user accessible blocks of non-volatile elements, each block having an associated defective block latch; and a controller which senses the defective block latch of each block, stores in temporary storage on the memory device address data corresponding to each block having the associated defective block latch set to indicate the block is defective, and subsequently retrieves the stored address data; and uses the address data to set the defective block latches corresponding to the address data to disable user accessible blocks based upon the address data.

10. The non-volatile memory device of claim 9 wherein the controller programs substantially all the user accessible blocks with an indicia indicating each respective block is defective.

11. The non-volatile memory device of claim 10 wherein the controller erases the indicia from user accessible blocks which have not been disabled.

12. The non-volatile memory device of claim 9 wherein the temporary storage comprises data registers associated with read and write circuitry of the memory device.

13. The non-volatile memory device of claim 9 wherein the controller comprises a state machine which senses the defective block latches, stores the address data, and stores a marker in the temporary storage to indicate an end of the address data in response to detecting a last user accessible block.

14. The non-volatile memory device of claim 11 wherein the controller programs each user accessible block with all zeros as the indicia indicating a block is defective.

15. The non-volatile memory device of claim 10 wherein the controller stores the address data in the form of address data and redundant address data.

16. The non-volatile memory device of claim 9 wherein the controller comprises a state machine which stores a flag bit set to a first state with the address data for each set latch sensed, and stores a flag bit set to a second state when all user accessible blocks have been sensed, and wherein the state-machine checks each flag bit and sets a corresponding defective block latch if the flag bit is in the first state to disable blocks corresponding to the address data.

17. A non-volatile memory device comprising:

a plurality of user accessible blocks of non-volatile storage elements, each block having an associated defective block latch, means for sensing each defective block latch to determine whether the defective block latch was set due to a defect;

means for storing, in temporary memory within the memory device, address data corresponding to each set latch;

means for retrieving the address data;

means for disabling all blocks corresponding to the address data;

means for resetting the set defective block latches after the address data has been stored and for programming substantially all the user accessible blocks with an indicia indicating each respective block is defective.

18. The memory device of claim 17 where the means for retrieving further comprises means for erasing the indicia from user accessible blocks which have not been disabled.

* * * * *